US006418359B1

(12) United States Patent
Wolf et al.

(10) Patent No.: US 6,418,359 B1
(45) Date of Patent: Jul. 9, 2002

(54) CONTROL DEVICE, ESPECIALLY A TEMPERATURE CONTROL DEVICE SUCH AS A ROOM TEMPERATURE CONTROL DEVICE

(75) Inventors: Roland Wolf, Hersbruck; Frank Eggebrecht, Altdorf; Hermann Köhler, Nürnberg; Bernhard Frenzel, Burgthann; Michael Neubauer, Nürnberg, all of (DE)

(73) Assignee: Inter Control Hermann Kohler GmbH & Co. KG, Nuremburg (DE)

( * ) Notice: Subject to any disclaimer, the term of this patent is extended or adjusted under 35 U.S.C. 154(b) by 0 days.

(21) Appl. No.: 09/380,167

(22) PCT Filed: Feb. 25, 1998

(86) PCT No.: PCT/DE98/00549
§ 371 (c)(1),
(2), (4) Date: Oct. 26, 1999

(87) PCT Pub. No.: WO98/38843
PCT Pub. Date: Sep. 3, 1998

(30) Foreign Application Priority Data

Feb. 28, 1997 (DE) .......................................... 197 08 210

(51) Int. Cl.⁷ ............................ G05D 23/19; H05K 5/00
(52) U.S. Cl. ........................ 700/299; 361/679; 236/1 B
(58) Field of Search .......................... 700/299, 71, 300; 702/130; 361/679, 683, 687, 688; 439/869, 872, 876, 874; 236/1 B, 1 C

(56) References Cited

U.S. PATENT DOCUMENTS 5,434,362 A 7/1995 Klosowiak et al. ......... 174/254

FOREIGN PATENT DOCUMENTS

| DE | 41 42 138 | 4/1993 |
| DE | 43 00 342 | 7/1994 |
| DE | 195 46 164 | 6/1996 |
| GB | 2 094 503 | 9/1982 |

OTHER PUBLICATIONS

Feldmann, I., "Molded Interconnect Devices—Recent Developments and Future Trends", (*Second International Congress on Molded Interconnect Devices*), pp. 5–16 (1996).

*Primary Examiner*—Paul P. Gordon
(74) *Attorney, Agent, or Firm*—Merchant & Gould, P.C.

(57) ABSTRACT

The invention relates to a control device, especially a temperature control device, comprising a sensor, a setpoint sensor, an electronic or electromechanical switch, an electricity supply unit, a control electronics unit and a casing encompassing said components. Said control device (1) is constructed by MID technology and the electronic and/or electromechanical components which make up the control device (1) are supported by walls of sections (7, 8, 9, 10) inside the casing and/or supporting elements (2) connected thereto. Said control device (1) has connecting contacts (3, 3') leading outwards. The electronic and/or electromechanical components are interconnected by means of strip conductors (16) located directly on the casing floor (15) and/or casing walls and/or interior casing sections (7, 8, 9, 10).

11 Claims, 4 Drawing Sheets

Figure 1:
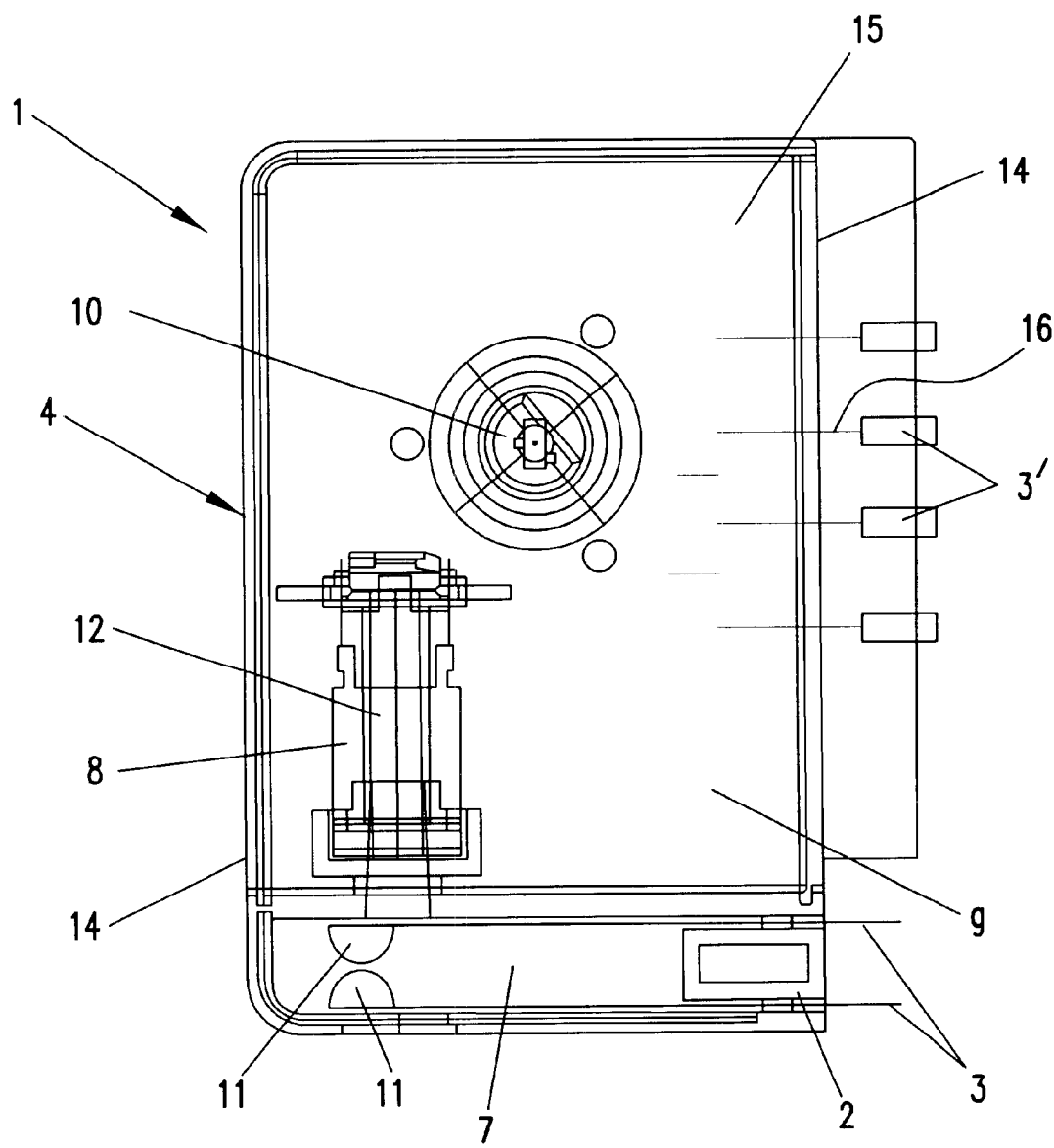

CONTROL DEVICE, ESPECIALLY A TEMPERATURE CONTROL DEVICE SUCH AS A ROOM TEMPERATURE CONTROL DEVICE

The invention concerns a control device, in particular a temperature control device.

Ordinarily, control devices consist of a control device housing, in which are arranged a sensor, a setpoint unit, an electronic and/or electromechanical switch in the form of a relay with switching contacts, a power supply unit, and control electronics. Such control devices are used in the form of room thermostats as room temperature control units for air conditioning equipment and thermal storage radiators. Additional application possibilities arise in refrigerators, wall direct-heat apparatus, stoves, automobiles, hot water heating systems, and the like.

Conventional control devices of the type in question are so constructed that they display an assembly board situated in a housing, on which board the essential component groups such as power supply, signal processor, adjusting unit, and switch are arranged. A temperature sensor, which belongs to such a device as regards its functioning, can either be integrated into the housing or located externally and connected to the room temperature control device by means of cables. Conventional control devices of the type in question have the disadvantage that the number of the mechanical components is relatively high and that in the total cost of such a device the assembly-cost portion is of fundamental significance.

The task forming the basis for the invention is to simplify and integrate a control device of this type from the point of view of its structure, and to so design it that essential supporting parts and wiring elements can be dispensed with.

This task is accomplished through a control unit having a temperature control device, with a sensor, a setpoint unit, an electronic switch, a current supply, control electronics, and a housing enclosing these components.

The control device is constructed in MID technology and the electronic and/or electromechanical components included in the control device are supported or carried by walls, by housing inner sections and/or support elements connected thereto.

The control device displays outward-leading connection contacts.

The electronic and/or electromechanical components are connected to one another through conductor paths applied directly to the housing bottom and/or the walls and/or the housing inner sections.

The housing walls are formed onto one section of the housing as one piece. Arranged in a first housing inner section is a pair of contacts that are supported directly by the housing walls and/or support elements and that pass through the outer housing wall with connection contacts. Arranged in a second housing inner section is an activation device that comprises a relay coil provided with a core plate, which relay coil is supported directly by the housing and is connected to the electronic components in MID technology, which components are arranged in a third housing section.

Advantageous further developments include but are not limited to the following features.

The housing may be composed of an upper section and a lower section.

The upper part and the lower part may hermetically enclose the inner region of the housing or the housing inner sections.

An adjustment shaft may be arranged in a fourth housing inner section, the adjustment shaft being connected to an adjustment unit.

The adjustment shaft of the adjustment unit may be guided rotatably in the lower part of the housing or in a guide piece injection-molded onto the latter, as well as in the upper part of the housing or in a guide bushing injection-molded onto the latter.

The fourth housing inner section may be circular in shape.

The outward-leading connection contacts may be borne directly by the outer housing parts.

The sensor may be arranged so as to be separate from the control device and to ascertain physical magnitudes.

The sensor may be a temperature sensor.

The sensor may be a temperature-sensitive mass that is attached to the housing.

The control device may contain processor that can process additional logical functions and links.

The core of the invention is considered to be constructing the control device using MID technology, the electronic and/or electromechanical components contained in the control unit being held or carried by walls, by housing inner sections, and/or holding elements connected thereto. In this, the control device displays connection contacts leading outward. The control device housing is produced using a cost effective injection molding process and is so designed that the electronic and/or electromechanical components can subsequently be easily placed into the housing inner section. The connection contacts leading outward from the control device can be injected into the housing wall either immediately or inserted later. The control device constructed in MID technology displays in addition conductor paths on the housing bottom and/or the housing walls, which paths connect the electronic and/or electromechanical components with one another. These conductor paths and contacts are produced, for example, by means of metallization and photo processes.

Produced through the MID technology is a control device that can be assembled in a simple manner, makes do with relatively few individual parts, and can be produced in an environmentally sealed manner and in very small volumes. The housing serves not merely as a bearer of the conductor paths, but also as a carrier and for guiding mechanical, moving components.

Advantageously, the housing can be composed of an upper part and a lower part, so that an easy assembly of the components is ensured.

In this connection, the upper and lower parts of the housing are advantageously designed in such a manner that they seal each other or the inner sections of the housing, in a hermetic manner. Such an air- and watertight sealing ensures a relatively trouble free operation and thus an exact regulating of temperature.

It is especially advantageous if the housing walls are formed as one piece onto the upper or lower part of the housing. For one thing, by this means the housing walls can be produced in one manufacturing step along with the upper or lower part of the housing; this is relatively easy to realize through the injection molding process. For another thing, the housing walls are sealed optimally where they are formed onto the upper or lower part.

In a first housing section a contact pair can be arranged, which pair is held directly by the housing walls and penetrates the outer housing wall with connection contacts. Here, one contact should be formed as a moving contact and the other as a fixed contact. The moving contact is actuated through an opening in an inner housing wall.

In a second housing inner section, which adjoins the first housing inner section, provision is made for an activation device, which impinges upon the moving contact by means of an element that passes through the mentioned inner housing wall.

The activation device appropriately comprises a relay coil provided with a core plate, which relay coil is supported directly by the housing.

In a third housing inner section can be arranged electronic components, which are connected to one another as well as to the additional electromechanical components through the conductor paths.

In a fourth housing inner section can be arranged an adjustment shaft, and in the region of the housing bottom, i.e. on the inner side of the housing bottom, a resistance circuit consisting of a potentiometer or a conductor path with peripherally changing optical reflection characteristics. The resistance circuit is contacted by a contact, which is connected to an adjustment shaft. The adjustment shaft for the adjusting can be rotatably guided in the lower part of the housing or in a guide piece injected into the latter, as well as in the upper part of the housing or a guide bushing injected into the latter.

Advantageously, the fourth housing inner section is designed as circular in shape, so that the adjustment shaft can be easily attached and a good guidance of the adjustment shaft is guaranteed. The separate enclosure of the adjustment unit is not susceptible to interference. The outward-leading connection contacts can be supported directly by the outer housing sections. If the connection contacts are injected directly into the outer housing wall, then the connection of connection contacts and housing wall can be designed sufficiently tight. Moreover, through this manner of production no additional manufacturing step is required for the attachment of the connection contacts.

The sensor can be arranged so as to be separate from the control device and can detect different physical variables. Consequently, when a sensor is defective it can be easily replaced.

Figure 2:
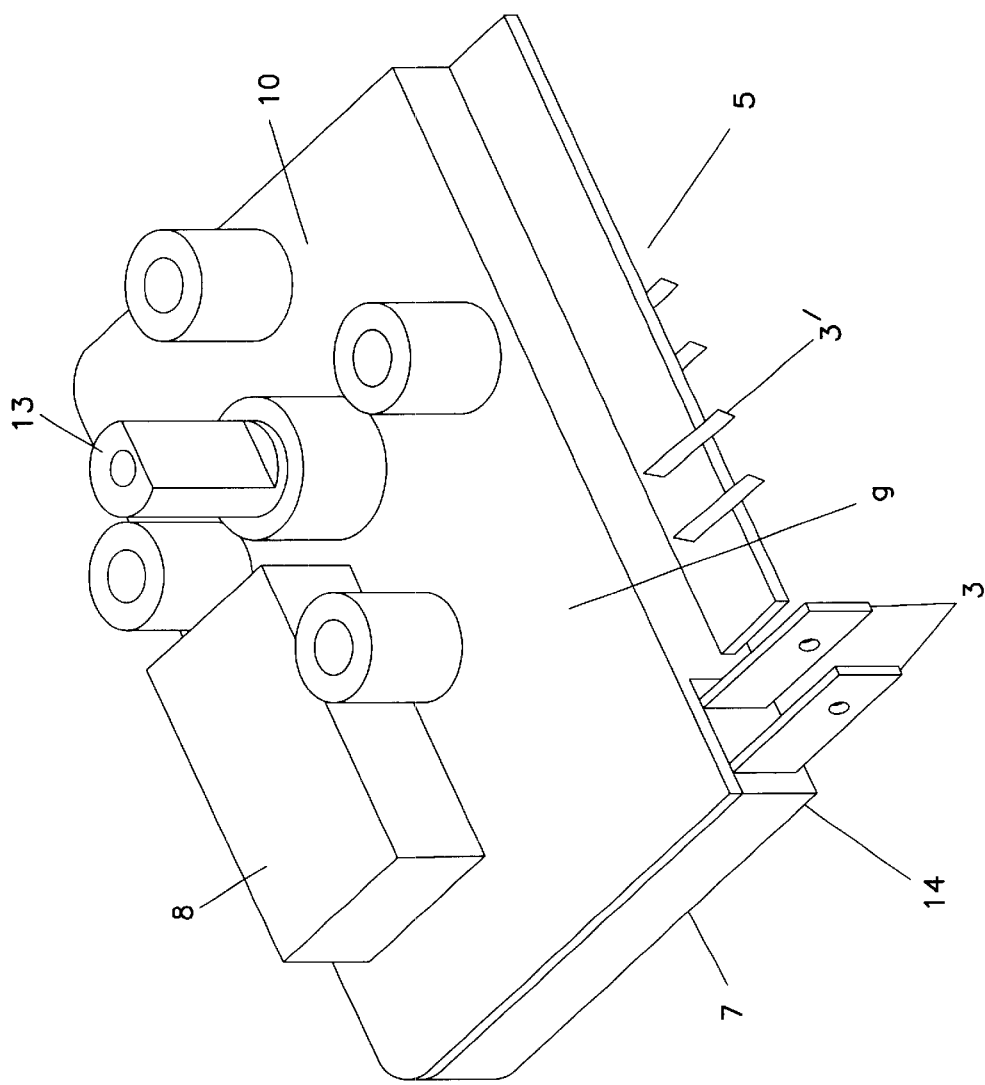
Figure 3:
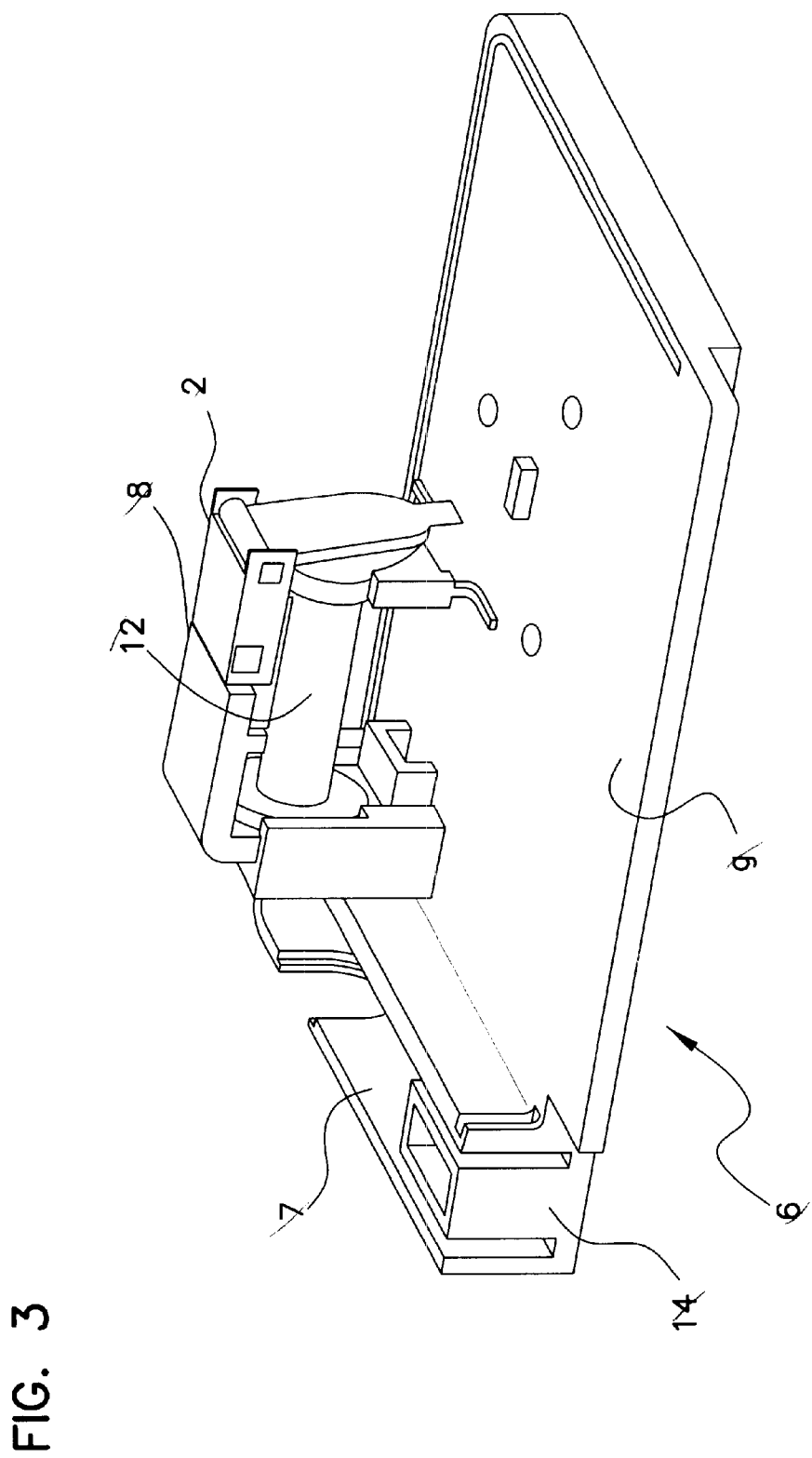
Figure 4:
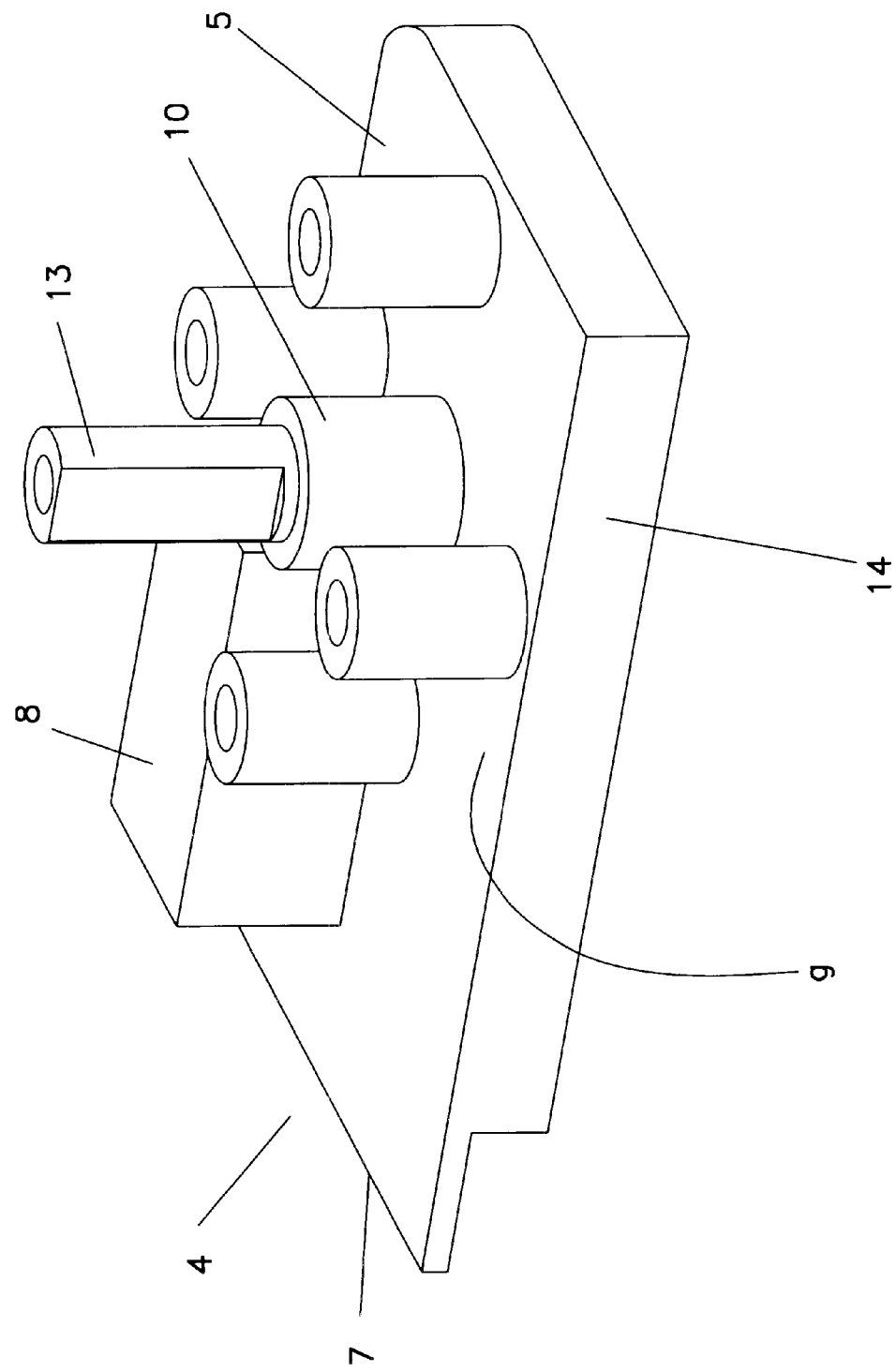

The invention is explained in greater detail with the aid of an advantageous implementation example in the drawn figures. These show:

FIG. 1: a plan view of the opened housing of the control device with the component groups, which are attached directly to the inner side of the housing bottom FIG. 2: a perspective view of the control device housing FIG. 3: a perspective view of the lower part of the control device housing FIG. 4: a perspective view of the upper part of the control device housing The control device 1, constructed in MID technology, is represented in FIG. 1 as an example. The control device 1 displays a housing 4 that consists of a housing bottom 15, outer housing walls 14, and several housing inner sections 7, 8, 9, 10. The control device contains electronic and/or electromechanical components, which are held or carried by the walls of the housing 4, by the housing inner sections 7, 8, 9, 10 and/or by support elements 2 joined thereto. Further, the control device 1 displays connection contacts 3, 3' leading outward, which are either injected together with the injection molding process or are later inserted into, or impressed upon, parts of the housing. In addition, the electronic and/or mechanical components are connected to one another by means of conductor paths 16 applied directly to the housing bottom 15. These conductor paths are indicated in FIG. 1 only schematically and can also be applied to the housing walls and/or the housing inner sections 7, 8, 9, 10.

From the perspective representation of the control device 1 in FIG. 2, it is evident that the housing 4 is assembled from an upper part 5 and a lower part 6. In this, the upper part 5 and the lower part 6 of the housing 4 are so designed that they hermetically close off the housing inner sections 7, 8, 9, 10.

The circular formations arranged around the fourth housing inner section 10 serve to receive fastening elements, for example screws.

As can be seen from FIGS. 3 and 4, the housing walls are formed onto the upper part 5 or the lower part 6 of the housing 4 as one piece. The housing walls serve to support or receive the electronic and/or electromechanical components and in this connection are so designed that they represent different housing inner sections 7, 8, 9, 10. Arranged in the first housing inner section 7 is a pair of contacts 11, which pair is supported directly by the housing walls and a support element 2, which is injected directly onto the housing 4. The contact pair 11 consists of one fixed and one moving contact and is connected to the connection contacts 3, which pass through the outer housing wall 14.

In a second housing inner section 8 is located an activation device. The activation device comprises in essence a relay coil 12 that is provided with a core plate, which relay coil is held directly by the second housing inner section 8, which is formed for this purpose.

In a third housing inner section 9 is arranged a number of electronic components, which are connected to one another through conducting paths 16 pressed directly onto the housing bottom 15. The electronic components are likewise supported directly by the housing bottom 15, so that the housing bottom 15 serves as circuit and component carrier.

In a fourth housing inner section 10 is arranged an adjustment shaft 13, which is connected to an adjustment unit. The adjustment unit comprises a resistance circuit attached in the region of the housing bottom 15, which resistance circuit is not represented in detail. The adjustment shaft 13 of the adjustment unit is guided in the lower part 6 of the housing 4 as well as in the upper part 5 of the housing 4, in such a way that it can be turned. This fourth housing inner section 10 is of a circular design and encloses the adjusting unit in a heretical manner so that the latter is protected against dust and external influences.

Protruding from the housing wall 14 are several additional connection contacts 3'. Connected to these connection contacts 3' is, for example, an external temperature sensor.

What is claimed is:

1. Control device, comprising a sensor, a setpoint unit, an electronic switch, a current supply, control electronics, and a housing enclosing the sensor, setpoint unit, electronic switch, and control electronics, wherein the control device is constructed with molded interconnect device (MID) technology, and components included in the control device are supported by at least one of walls of the housing, housing inner sections, and support elements, the control device comprises outward-leading connection contacts, the sensor, setpoint unit, electronic switch, and control electronics are connected to one another through conductor paths applied directly to at least one of a housing bottom, the walls, and the housing inner sections, the housing walls are formed onto one section of the housing as one piece, arranged in a first housing inner section is a pair of contacts that are supported directly by at least one of the housing walls and the support elements, the pair of contacts passing through an outer housing wall with connection contacts, and arranged in a second housing inner section is an activation device that comprises a relay coil comprising a core plate, the relay coil being supported directly by the housing and being connected to the sensor, setpoint unit, electronic switch, and control electronics with MID technology, sensor, setpoint unit, electronic switch, and control electronics with being arranged in a third housing section.

2. Control device according to claim 1, wherein the housing is composed of an upper section and a lower section.

3. Control device according to claim 1, wherein an upper part and a lower part hermetically enclose the inner region of the housing or the housing inner sections.

4. Control device according to claim 1, wherein arranged in a fourth housing inner section is an adjustment shaft, the adjustment shaft being connected to an adjustment unit.

5. Control device according to claim 4, wherein the adjustment shaft is guided rotatably in at least one of a lower part of the housing, a guide piece injection-molded onto the lower part of the housing, an upper part of the housing, and a guide bushing injection-molded onto the upper part of the housing.

6. Control device according to claim 4, wherein the fourth housing inner section is circular in shape.

7. Control device according to claim 1, wherein the outward-leading connection contacts are borne directly by the outer housing parts.

8. Control device according to claim 1, wherein the sensor is arranged so as to be separate from the control device, and is adapted to ascertain physical magnitudes.

9. Control device according to claim 8, wherein the sensor is a temperature sensor.

10. Control device according to claim 9, wherein the sensor comprises a temperature-sensitive mass attached to the housing.

11. Control device according to claim 1, wherein the control device comprises a processor adapted to process additional logical functions and links.

* * * * *